US009154033B2

(12) United States Patent
Hoshino et al.

(10) Patent No.: US 9,154,033 B2
(45) Date of Patent: Oct. 6, 2015

(54) CURRENT CONTROL SEMICONDUCTOR DEVICE AND CONTROL DEVICE USING THE SAME

(75) Inventors: Kenichi Hoshino, Hitachinaka (JP); Teppei Hirotsu, Tokyo (JP); Ryosuke Ishida, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 36 days.

(21) Appl. No.: 14/130,688
(22) PCT Filed: Jul. 3, 2012
(86) PCT No.: PCT/JP2012/066993
§ 371 (c)(1),
(2), (4) Date: Jan. 3, 2014
(87) PCT Pub. No.: WO2013/008683
PCT Pub. Date: Jan. 17, 2013

(65) Prior Publication Data
US 2014/0145696 A1 May 29, 2014

(30) Foreign Application Priority Data
Jul. 14, 2011 (JP) ................................. 2011-156013

(51) Int. Cl.
H03M 1/14 (2006.01)
H02M 3/157 (2006.01)
H03M 1/06 (2006.01)
H03M 1/12 (2006.01)
F02D 41/20 (2006.01)

(52) U.S. Cl.
CPC ............ *H02M 3/157* (2013.01); *H03M 1/0609* (2013.01); *F02D 2041/2024* (2013.01); *F02D 2041/2058* (2013.01); *H03M 1/12* (2013.01)

(58) Field of Classification Search
CPC ....... H03M 1/12; H03M 1/06; H03M 1/1609; H03M 1/1004; G01R 35/00; G01R 19/32; G01R 19/25; G01R 19/257; G06F 1/10
USPC ........ 323/281, 283; 327/3, 74, 538, 539, 540, 327/541; 341/56, 118, 120, 143, 155, 157, 341/158; 702/107, 761
See application file for complete search history.

(56) References Cited

U.S. PATENT DOCUMENTS

| 4,766,417 A | 8/1988 | Takayama et al. |
| 7,152,010 B1 * | 12/2006 | Tsyrganovich ............... 323/283 |
| 2011/0101959 A1 | 5/2011 | Hirotsu et al. |

FOREIGN PATENT DOCUMENTS

| JP | 62-289016 A | 12/1987 |
| JP | 2003-31415 A | 1/2003 |

(Continued)

OTHER PUBLICATIONS

International Search Report (PCT/ISA/210) with English translation dated Aug. 7, 2012 (Five (5) pages).

Primary Examiner — Adolf Berhane
Assistant Examiner — Jye-June Lee
(74) Attorney, Agent, or Firm — Crowell & Moring LLP

(57) ABSTRACT

A current control semiconductor device that can detect a current with high precision within an IC of one chip by dynamically correcting a variation in a gain a and an offset b, and a control device using the semiconductor device are provided. A transistor 4, a current-voltage converter circuit 22, and an AD converter 23 are disposed on an identical semiconductor chip. Reference current generator circuits 6 and 6' superimpose a current pulse Ic on a current of a load 2, and vary a voltage digital value output by the AD converter. A gain/offset correction unit 8 subjects a variation in a voltage digital value caused by the reference current generator circuits 6, 6' to signal processing, and dynamically acquires gains a, a' and offsets b, b' in a linear relational expression of the voltage digital value output by the AD converter 23 and a current digital value of the load. A current digital value calculation unit 12 corrects a voltage value output by the AD converter with the use of the gain and the offset acquired by the gain/offset correction unit 8.

6 Claims, 10 Drawing Sheets

(56) References Cited

FOREIGN PATENT DOCUMENTS

| | | |
|---|---|---|
| JP | 2003-203805 A | 7/2003 |
| JP | 2006-165100 A | 6/2006 |
| JP | 2011-97434 A | 5/2011 |
| WO | WO 2012/029485 A1 | 3/2012 |

* cited by examiner

CURRENT CONTROL SEMICONDUCTOR DEVICE AND CONTROL DEVICE USING THE SAME

TECHNICAL FIELD

The present invention relates to a current control semiconductor device, and a control device using the semiconductor device, and more particularly to a current control semiconductor device suitable for a current detector circuit incorporated into an IC chip, and a control device using the semiconductor device.

BACKGROUND ART

Electric actuators such as motors or solenoids have been extensively used for converting an electric signal into a mechanical motion or a hydraulic pressure as various objects to be controlled are electronically controlled. In order to upgrade those electric actuators, a high-precision current control is essential. In recent years, for the purpose of conducting a high-precision current control, it is general to use a digital feedback control.

For the purpose of conducting a current digital feedback control, there is a need to acquire a digital value Ioutd of a load current value Iout to be controlled. To achieve this, an output Vout of a current-voltage converter circuit is subjected to digital conversion by an AD converter to obtain a relative digital value Voutd (=Vout/Vref) to a reference voltage Vref of the AD converter. Then, the output Voutd of the AD converter is subjected to a correction corresponding to an input/output characteristic of a current detector circuit including the current-voltage converter circuit and the AD converter to obtain the digital value Ioutd of the current.

Various configurations of the current detector circuit have been proposed. From the viewpoint of simplifying a control algorithm, it is desirable to make the input/output characteristic of the current detector circuit linear, and in this case, the current digital value Ioutd is obtained by Expression (1) with the use of a gain a and an offset b.

$$Ioutd = a \cdot Voutd + b \quad (1)$$

When the current value is measured according to Expression (1), it is important how the gain a and the offset b match the characteristic of a real current detector circuit with high precision, for the purpose of improving a current measurement precision.

Also, needs of the downsized control device and the lower prices are high in addition to the high-precision current control, and the current detector circuit is incorporated into an IC chip to respond to those needs. A current detection resistor incorporated into the IC chip to incorporate the current detector circuit into the IC chip has been known (for example, refer to PTL 1 and PTL 2).

CITATION LIST

Patent Literature

PTL 1: JP-A-2003-203805
PTL 2: JP-A-2006-165100

SUMMARY OF INVENTION

Technical Problem

A method of incorporating the current detection resistor into the IC chip is excellent in the downsized device and the lower price because an external component for current detection can be reduced.

However, a value of the resistor formed within the IC chip is varied by tens of % depending on a temperature, and this value appears as a variation of the gain a in Expression (1) as it is. Also, the variation of the reference voltage Vref of the AD converter used in the digital conversion of the detected current value also causes a variation of the gain a by several %. Further, the offset b in Expression (1) is also varied by several % due to an input offset of an operational amplifier used in the current detector circuit.

In this way, there arises such a problem that when the current detector circuit is incorporated into the IC chip, the gain a and the offset b in Expression (1) are largely varied as compared with designed values, and a current detection error increases.

An object of the present invention is to provide a current control semiconductor device that can detect a current with high precision within an IC of one chip by dynamically correcting the variations of the gain a and the offset b, and a control device using the semiconductor device.

Solution to Problem (1) In order to achieve the above object, according to the present invention, there is provided a current control semiconductor device having, on an identical semiconductor chip, a transistor that drives a load, a current-voltage converter circuit that converts a current of the load into a voltage, and an AD converter that converts an output voltage of the current-voltage converter circuit into a digital value, the current control semiconductor device including: a reference current generation unit that superimposes a current pulse on a current of the load to vary a voltage digital value output by the AD converter; a gain/offset correction unit that subjects a variation in the voltage digital value by the reference current generation unit to signal processing to dynamically acquire a gain and an offset in a linear relational expression of the voltage digital value output by the AD converter and a current digital value of the load; and a current digital value calculation unit that corrects a voltage value output by the AD converter with the use of the gain and offset acquired by the gain/offset correction unit.

With the above configuration, the variation in the gain a and the offset b is dynamically corrected to enable a high-precision current detection within the IC of one chip.

(2) In the above item (1), preferably, there is provided a correction measured value holding unit that holds a current value of the current pulse measured from the external with high precision, in which the gain/offset correction unit dynamically acquires the gain in the linear relational expression of the voltage digital value output by the AD converter and the current digital value of the load with the use of the current value of the current pulse held by the correction measured value holding unit, and a signal processing result of the voltage digital value.

(3) In the above item (2), preferably, a current of the current pulse is generated with the use of a resistor and a reference voltage.

(4) In the above item (2), preferably, a cycle of the current pulse is an integral multiple of the sampling cycle of the AD converter.

(5) In the above item (2), preferably, when a current is controlled by PWM, a cycle of the current pulse is an integral multiple of the PWM cycle.

(6) Also, in order to achieve the above object, according to the present invention, there is provided a control device including a current control semiconductor device, and a microcontroller that controls the current control semiconductor device, the current control semiconductor device having, on an identical semiconductor chip, a transistor that drives a load, a current-voltage converter circuit that converts a current of the load into a voltage, and an AD converter that converts an output voltage of the current-voltage converter circuit into a digital value, in which the current control semiconductor device includes: a reference current generation unit that superimposes a current pulse on a current of the load to vary a voltage digital value output by the AD converter; a gain/offset correction unit that subjects a variation in the voltage digital value by the reference current generation unit to signal processing to dynamically acquire a gain and an offset in a linear relational expression of the voltage digital value output by the AD converter and a current digital value of the load; and a current digital value calculation unit that corrects a voltage value output by the AD converter with the use of the gain and offset acquired by the gain/offset correction unit.

With the above configuration, the variation in the gain a and the offset b is dynamically corrected to enable a high-precision current detection within the IC of one chip, and a control precision of the control device can be improved.

Advantageous Effects of Invention

According to the present invention, the variation in the gain a and the offset b is dynamically corrected to enable the high-precision current detection within the IC of one chip.

DESCRIPTION OF EMBODIMENTS

Hereinafter, a configuration and operation of a current control semiconductor device according to one embodiment of the present invention will be described with reference to FIGS. 1 to 5.

First, the configuration of the current control semiconductor device according to this embodiment will be described with reference to FIG. 1.

Figure 1:
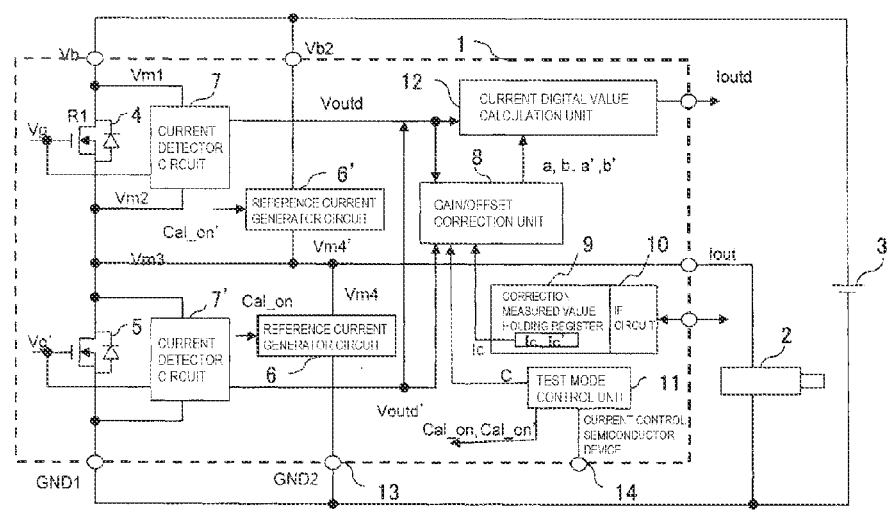
FIG. 1 is a block diagram illustrating a configuration of a current control semiconductor device according to one embodiment of the present invention.

FIG. 1 is a block diagram illustrating the configuration of the current control semiconductor device according to one embodiment of the present invention.

A current control semiconductor device 1 includes a highside MOSFET 4, a lowside MOSFET 5, reference current generator circuits 6, 6', a current detector circuit 7, a gain/offset correction unit 8, a correction measured value holding register 9, an IF circuit 10, and a test mode control unit 11.

The current control semiconductor device 1 is connected to a solenoid 2, and a battery 3 that applies a voltage to the solenoid 2, turns on/off the voltage to be applied to the solenoid 2, controls a current flowing in the solenoid 2, and drives the solenoid 2 with the use of PWM (Pulse Width Modulation).

The highside MOSFET 4 is a switch disposed between the solenoid 2 and the battery 3, which turns on when a gate signal Vg of the highside MOSFET 4 is high level, and turns off when the gate signal Vg is low level. A current flowing in the solenoid 2 increases when the highside MOSFET 4 is on, and the lowside MOSFET 5 is off, and decreases when the highside MOSFET 4 is off.

The lowside MOSFET 5 turns on during an off-period of the highside MOSFET 4, and the lowside MOSFET 5 is used as a path along which the current flowing in the solenoid 2 flows back when the highside MOSFET 4 is off.

The current detector circuit 7 is connected in parallel to the highside MOSFET 4, converts a current flowing in the highside MOSFET 4, that is, a current flowing in the solenoid 2 into a voltage, and outputs a digital value Voutd of the voltage. The reference current generator circuit 6 generates a reference current for correcting a gain a and an offset b in Expression 1 representing a relationship between a current digital value flowing in the solenoid 2 and a voltage digital value output by the current detector circuit 7.

A current detector circuit 7' is connected in parallel to the lowside MOSFET 5, converts a current flowing in the lowside MOSFET 5, that is, a feedback current when the highside MOSFET 4 is off into a voltage, and outputs a digital value Vout' of the voltage.

The reference current generator circuit 6 generates a reference current for correcting the gain a and the offset b in the above-mentioned Expression (1) representing a relationship between the current digital value flowing in the solenoid 2 and the voltage digital value output by the current detector circuit 7.

The reference current generator circuit 6' generates a reference current for correcting the gain a and the offset b in Expression 1 representing a relationship between the current digital value flowing when a current is fed back and a voltage digital value output by the current detector circuit 7'. In this example, for the purpose of distinguishing from the gain a and the offset b determined according to the output of the current detector circuit 7, the gain and the offset are set as a gain a' and an offset b', respectively.

When the highside MOSFET 4 is on, the lower reference current generator circuit 6 is driven, and when the lowside MOSFET 5 is on, the upper reference current generator circuit 6' is driven.

The correction measured value holding register 9 holds current values Ic and Ic' of a current pulse generated by the reference current generator circuit 6, 6', for correction of the gains a, a', and the offsets b, b' of the gain/offset correction unit 8.

The gain/offset correction unit 8 corrects the gain a and the offset b according to the output Voutd of the current detector circuit 7 and the current value held by the correction measured value holding register 9, and outputs the corrected values to a current digital value calculation unit 12.

The current digital value calculation unit 12 outputs a digital value Ioutd of the current on the basis of the Voutd input from the current detector circuit 7, and the gains a, a', and the offsets b, b' input from the gain/offset correction unit 8 through Expression (1).

The IF circuit 10 provides an interface function of reading and writing the value Ic held by the correction measured value holding register 9 from the external of the current control semiconductor device 1.

The test mode control unit 11 is started from the external through a terminal 14. When the test mode control unit 11 starts, the reference current generator circuit 6, is controlled with the use of a control signal Cal_on to output a current flowing in the reference current generator circuit 6 to a terminal 13 so that a current value flowing into the reference current generator circuit 6 from the external can be measured. The measured current value Ic is held in the correction measured value holding register 9 through the IF circuit 10. The start of the test mode control unit 11 from the external through the terminal 14 is conducted before factory shipment of the current control semiconductor device 1.

Also, the test mode control unit 11 outputs a correction instruction C on the basis of information on an internal temperature T of the current control semiconductor device 1 to start the gain/offset correction unit 8. Then, the gain/offset correction unit 8 corrects the gains a, a', and the offsets b, b' according to the output Voutd of the current detector circuit 7 and the current value held by the correction measured value holding register 9, and outputs the corrected values to the current digital value calculation unit 12. That is, when the present temperature is changed from a temperature at which the gains a, a', and the offsets b, b' have been previously corrected by a given temperature or higher, the test mode control unit 11 starts the gain/offset correction unit 8, corrects the gains a, a', and the offsets b, b', and outputs the corrected values to the current digital value calculation unit 12. The internal temperature T of the current control semiconductor device 1 is measured with the use of a temperature dependency of a resistance value formed within the current control semiconductor device 1.

Subsequently, a configuration of the current detector circuit 7 used in the current control semiconductor device 1 according to this embodiment will be described with reference to FIGS. 2A and 2B.

Figure 2A:
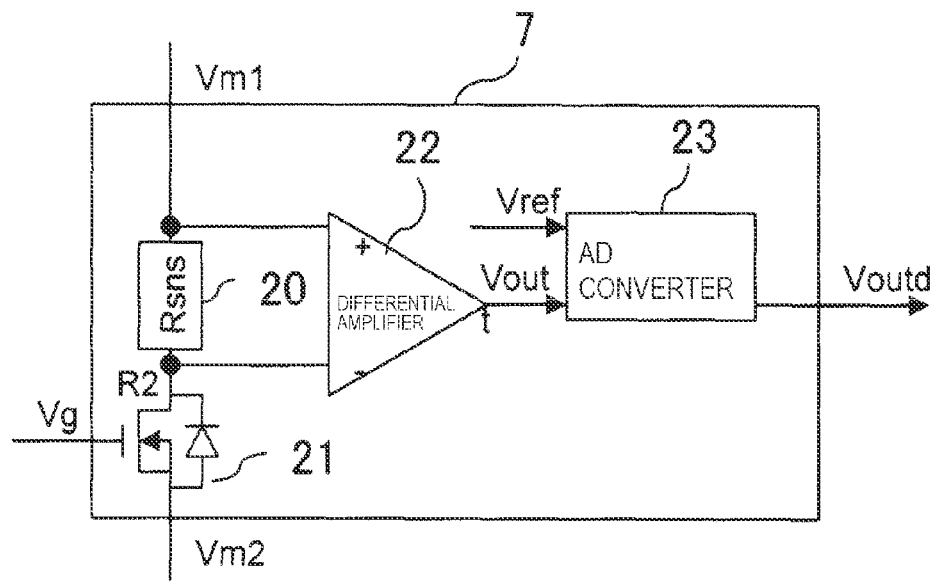
FIG. 2A is a block diagram illustrating a configuration of a current detector circuit used in the current control semiconductor device according to one embodiment of the present invention.
Figure 2B:
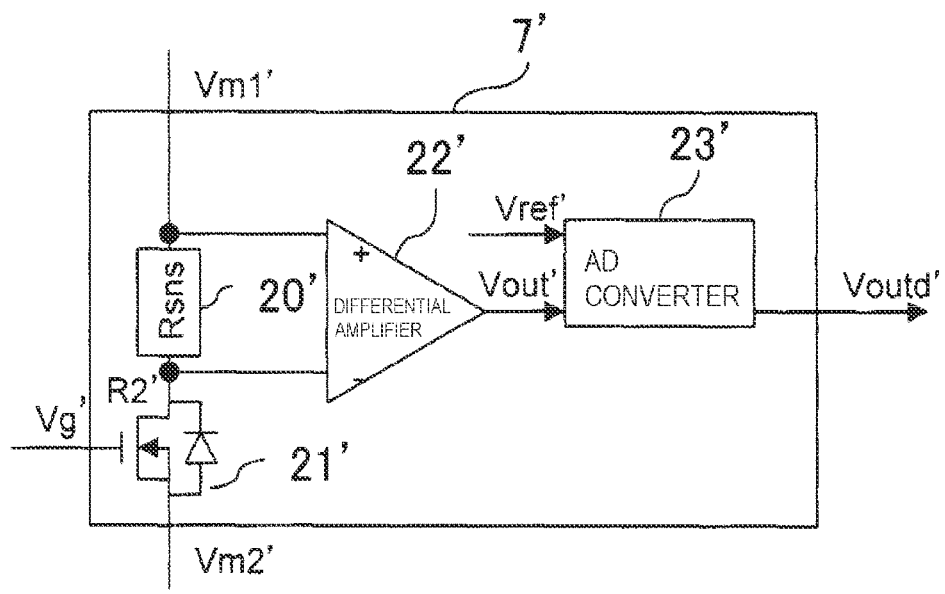
FIG. 2B is a block diagram illustrating a configuration of a current detector circuit used in the current control semiconductor device according to one embodiment of the present invention.

FIGS. 2A and 2B are block diagrams illustrating the configuration of the current detector circuit used in the current control semiconductor device according to one embodiment of the present invention.

The current detector circuit 7 illustrated in FIG. 2A includes a sense MOSFET 21, which is on when the gate signal Vg is high level, that is, while a current is supplied to the highside MOSFET 4, and supplies a current divided at a division ratio determined according to an on-resistance ratio of the highside MOSFET 4 and the sense MOSFET 21 to a sense resistor Rsns 20. A differential amplifier 22 amplifies a potential difference between both ends of the sense resistor Rsns 20, and outputs a voltage value Vout. An AD converter 23 subjects the output voltage value Vout of the differential amplifier 22 to digital conversion in a sampling period Ts, and outputs a relative digital value Voutd=Vout/Vref to a reference voltage Vref.

Because the characteristics of the current detector circuit 7 described above is linear, a relationship between the digital value Ioutd of the current and the output Voutd of the current detector circuit 7 can be represented by Expression (1) with the use of the gain a and the offset b.

The current detector circuit 7' illustrated in FIG. 2B includes a sense MOSFET 21', which is on when the gate signal Vg is high level, that is, while a current is supplied to the lowside MOSFET 5, and supplies a current divided at a division ratio determined according to an on-resistance ratio of the lowside MOSFET 5 and the sense MOSFET 21' to a sense resistor Rsns 20'. A differential amplifier 22' amplifies a potential difference between both ends of the sense resistor Rsns 20', and outputs a voltage value Vout'. An AD converter 23' subjects the output voltage value Vout' of the differential amplifier 22' to digital conversion in the sampling period Ts, and outputs a relative digital value Voutd'=Vout'/Vref' to a reference voltage Vref'.

Because the characteristics of the current detector circuit 7' described above is linear, a relationship between the digital value Ioutd of the current and the output Voutd' of the current detector circuit 7 can be represented by Expression (1) with the use of the gain a' and the offset b'.

Subsequently, a configuration of the reference current generator circuit 6 used in the current control semiconductor device according to this embodiment will be described with reference to FIGS. 3A and 3B.

Figure 3A:
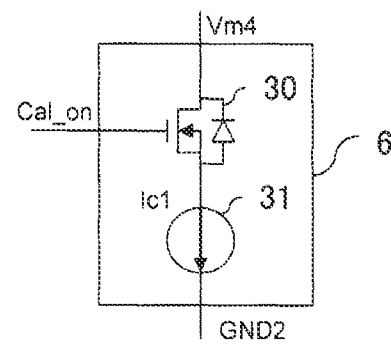
FIG. 3A is a block diagram illustrating a configuration of a reference current generator circuit used in the current control semiconductor device according to one embodiment of the present invention.
Figure 3B:
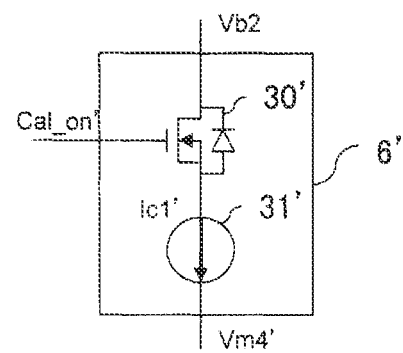
FIG. 3B is a block diagram illustrating a configuration of a reference current generator circuit used in the current control semiconductor device according to one embodiment of the present invention.

FIGS. 3A and 3B are block diagrams illustrating the configuration of the reference current generator circuit used in the current control semiconductor device according to one embodiment of the present invention.

The reference current generator circuit 6 illustrated in FIG. 3A includes a MOSFET 30 which is supplied with a current of a constant current source 31 having a current value Ic1 when the gate signal Cal_on is high level.

The reference current generator circuit 6' illustrated in FIG. 3B includes a MOSFET 30' which is supplied with a current of a constant current source 31' having a current value Ic1' when a gate signal Cal_on' is high level.

Subsequently, a method of correcting the gain a and the offset b in the current control semiconductor device according to this embodiment will be described with reference to FIGS. 4A and 4B.

Figure 4A:
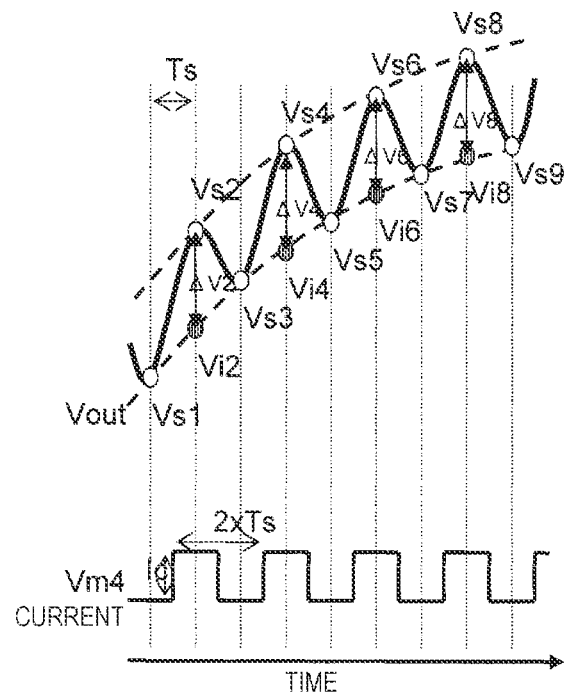
FIG. 4A is an illustrative view of a method for correcting a gain and an offset in the current control semiconductor device according to one embodiment of the present invention.
Figure 4B:
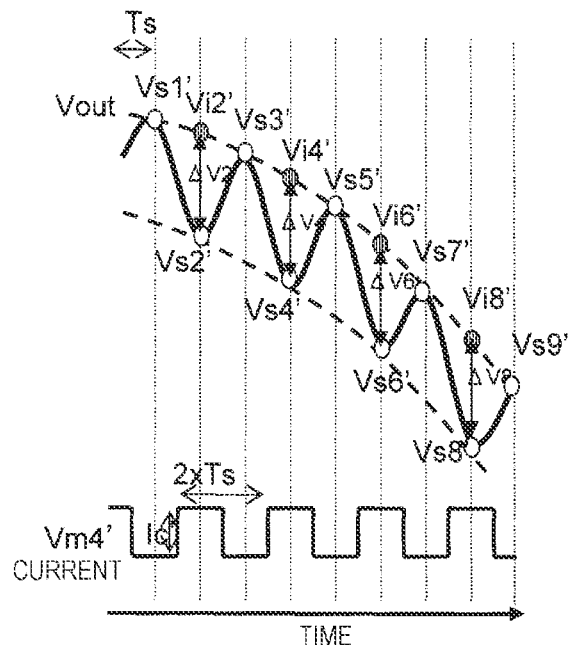
FIG. 4B is an illustrative view of a method for correcting a gain and an offset in the current control semiconductor device according to one embodiment of the present invention.

FIGS. 4A and 4B are illustrative views of a method for correcting the gain and the offset in the current control semiconductor device according to one embodiment of the present invention.

In order to correct the gain a, the reference current generator circuit 6 superimposes a current pulse having an amplitude of Ic and a cycle of 2·Ts which is twice as large as the sampling period of the AD converter 23 on a solenoid current, and varies the output Vout of the differential amplifier 22.

In an example illustrated in FIG. 4A, the relative digital value Voutd series output by the AD converter 23 is voltages Vs1, Vs2, ..., Vs9, and the voltages Vs2, Vs4, ..., Vs8 with even index among those voltages are digital values sampled when the current pulse of the amplitude Ic by the reference current generator circuit 6 is supplied.

In this example, midpoint voltages Vi2=Vs1+Vs3/2, Vi4=Vs3+Vs5/2, ..., Vi8=Vs7+Vs9/2 are calculated from Voutd series whose index is odd, and respective differences from the voltages Vs2, Vs4, ..., Vs8 whose corresponding index is even are calculated to obtain difference voltages $\Delta V2$, $\Delta V4$, ..., $\Delta V8$. The difference voltages $\Delta V2$, $\Delta V4$, ... $\Delta V8$ thus calculated are digital values of Vout variation generated by supplying the current pulse of the amplitude Ic to the solenoid current by the reference current generator circuit 6.

In order to suppress an influence on the solenoid current caused by the reference current supply, the amplitude Ic of the current pulse generated by the reference current generator circuit 6 is limited to be small as compared with the solenoid current value. As a result, a quantization error of the respective difference voltage $\Delta V2$, $\Delta V4$, ..., $\Delta V8$ values becomes large, but the quantization error can be reduced by calculating a mean value ave$\Delta V$.

Further, an output of the current detector circuit 7' when the highside MOSFET 4 is off, that is, when the lowside MOSFET 5 is on, can be calculated with the use of the reference current generator circuit 6', likewise. In this situation, the pulse current Ic' supplied as illustrated in FIG. 4B is superimposed on a minus side, and how to obtain the mean value ave ($\Delta V$) is obtained by the following procedure, likewise.

One method of correcting the gain a' and the offset b' by the gain/offset correction unit 8 will be described with reference to FIG. 4B.

In order to correct the gain a', the reference current generator circuit 6' superimposes a current pulse having an amplitude of Ic' and a cycle which is twice as large as the sampling period of the AD converter 23' on the solenoid current, and varies the output Vout' of the differential amplifier 22'. In the example illustrated in FIG. 4B, Voutd' series output by the AD converter 23' is Vs1', Vs2', ..., Vs9', and Vs2', Vs4', ..., Vs8' with even index among those voltages are digital values sampled when the current pulse of the amplitude Ic' by the reference current generator circuit 6' is supplied.

In this example, midpoint Vi2'=(Vs1'+Vs3')/2, Vi4'=(Vs3'+Vs5')/2, ..., Vi8'=(Vs7'+Vs9')/2 are calculated from Voutd' series whose index is odd, and respective differences from the voltages Vs2', Vs4', ..., Vs8' whose corresponding index is even are calculated to obtain difference voltages $\Delta V2'$, $\Delta V4'$, ..., $\Delta V8'$. The difference voltages $\Delta V2'$, $\Delta V4'$, ... $\Delta V8'$ thus calculated are digital values of Vout' variation generated by supplying the current pulse of the amplitude Ic' to the solenoid current by the reference current generator circuit 6'.

In order to suppress an influence on the solenoid current caused by the reference current supply, the amplitude Ic' of the current pulse generated by the reference current generator circuit 6' is limited to be small as compared with the solenoid current value. As a result, a quantization error of the respective difference voltage $\Delta V2'$, $\Delta V4'$, ..., $\Delta V8'$ values becomes large, but the quantization error can be reduced by calculating a mean value ave ($\Delta V'$).

The gains a and a' in Expression (1) can be calculated with high precision through Expression (2) with the use of ave ($\Delta V$) and ave($\Delta V'$) thus obtained, and the supplied pulse currents Ic and Ic'.

$$a=Ic/ave(\Delta V), a'=Ic'/ave(\Delta V) \quad (2)$$

Also, the offsets b and b' can be obtained through Expressions (1) and (2) with the use of Expression (3).

$$b=-a \cdot Voutd\_off, b'=-a' \cdot Voutd'\_off \quad (3)$$

In this example, the current value Ic1 (Ic1') of the constant current source 31 (31') is measured from the external with the use of the test mode control unit 11 with high precision, and the value is stored in a nonvolatile memory in advance. When the current control semiconductor device 1 starts, the value of Ic (Ic') is transferred to the correction measured value holding register 9 for current measurement through the IF circuit 10 in advance.

As a result, the gain/offset correction unit 8 can measure the Voutd (Voutd') variation at arbitrary timing requiring correction to obtain the gain a (a') and the offset b (b') through Expressions (2) and (3) with the use of a value of the Ic (Ic') stored in the correction measured value holding register 9 for current measurement.

The correction error of the gain a (a') and the offset b (b') by the gain/offset correction unit 8 described above depends on an absolute error of the current value Ic (Ic') of the constant current source 31 (31'), but a current value of the constant current source does not depend on the power supply or the temperature, but a variation of the current value can approximate 0 in principle. Therefore, the gain a (a') and the offset b (b') can be corrected with high precision.

Hence, according to this embodiment, the gain a (a') and the offset b (b') can be corrected with high precision to measure the current with high precision.

In the above description, the reference current generator circuit 6 superimposes the current pulse having the cycle of 2·Ts which is twice as large as the sampling period of the AD converter 23 on the solenoid current, but may superimpose a current pulse having a cycle which is another integral multiple, three times, four times of the sampling period of the AD converter 23 on the solenoid current. For example, Ts of the sampling period of the AD converter 23 is about 10 μs. On the other hand, when the rising of the superimposed reference current Ic is early, $\Delta V$ is obtained according to the principle described in FIG. 4 so that an increment caused by the reference current Ic can be accurately detected. If the rising of the superimposed reference current Ic is late, $\Delta V$ may not accurately indicate the increment caused by the reference current Ic. In this case, the reference current generator circuit 6 superimposes the current pulse having a cycle which is another integral multiple, three times, four times of the sampling period of the AD converter 23 on the solenoid current so as to detect the increment caused by the reference current Ic more precisely.

Another method of correcting the gains a, a' and the offsets b, b' in the current control semiconductor device according to this embodiment will be described with reference to FIG. 5.

Figure 5:
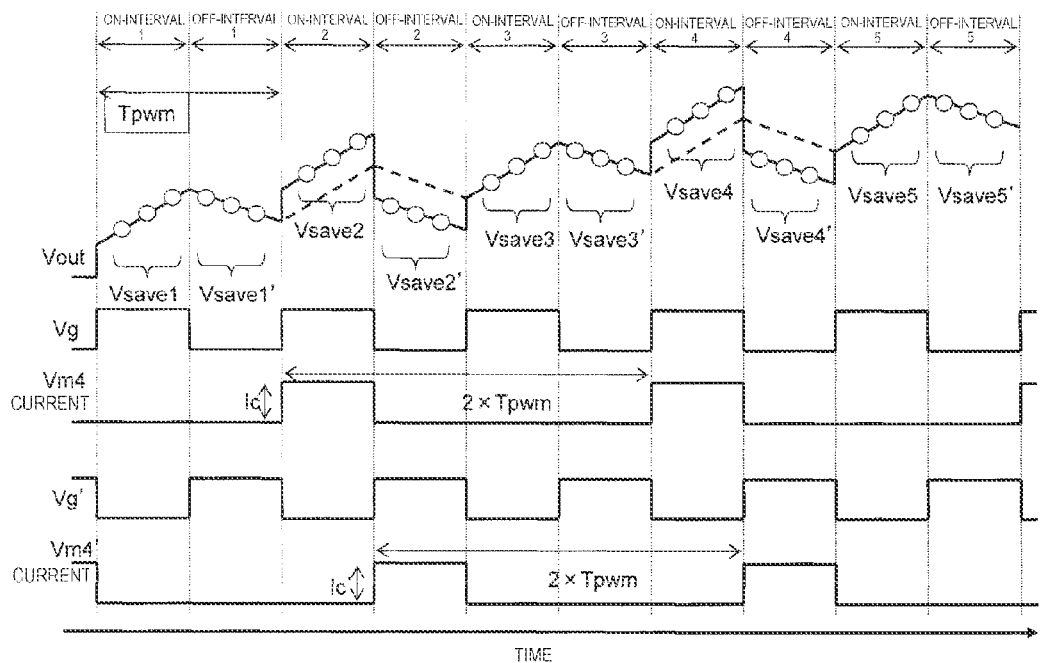
FIG. 5 is an illustrative view of a method for correcting a gain and an offset in the current control semiconductor device according to one embodiment of the present invention.

FIG. 5 is an illustrative view of another method for correcting the gains a, a', and the offsets b, b' in the current control semiconductor device according to one embodiment of the present invention.

In this example, the AD converter 23 illustrated in FIG. 2 is of a $\Delta\Sigma$ modulation system.

In order to correct the gain a, the reference current generator circuit 6 superimposes a current pulse having an amplitude of Ic and a cycle which is twice as large as the PWM period on the solenoid current, and varies the output Vout of the differential amplifier 22 for each PWM period. In the example illustrated in FIG. 5, the reference current generator circuit 6 supplies the current pulse of the amplitude Ic in an on-interval 2 and an on-interval 4.

A Voutd mean value series and Vsave1, Vsave2, ..., Vsave5 in the PWM on-period are acquired by the AD converter of the ΔΣ modulation system, and among them, Vsave2 and Vsave4 are mean values of Voutd in the PWM on-state where the current pulse of the amplitude Ic by the reference current generator circuit 6 is supplied.

In this example, midpoint Viave2=(Vsave1+Vsave3)/2 and Viave4=(Vsave3+Vsave5)/2 are calculated from the Voutd mean value series whose index is odd, and respective differences ΔVave2=Vsave2−Viave2 and ΔVave4=Vsave4−Viave4 from Vsave2 and Vsave4 whose corresponding index is even are obtained. ΔVave2 and ΔVave4 thus calculated are mean values of the Voutd variation generated by adding the current pulse of the amplitude Ic to the solenoid current by the reference current generator circuit 6.

In order to suppress an influence on the solenoid current caused by the reference current supply, the amplitude Ic of the current pulse generated by the reference current generator circuit 6 is limited to be small as compared with the solenoid current value. As a result, a quantization error of the respective ΔVave2 and ΔVave4 comes large, but the quantization error can be reduced by calculating the mean value ave (ΔVave) as ave (ΔV)=(ΔVave2+ΔVave4+ ... )/n.

Like the example of FIGS. 1 to 4, the output of the current detector circuit 7' when the highside MOSFET 4 is off, that is, when the lowside MOSFET 5 is on can be calculated with the reference current generator circuit 6', likewise. In the example illustrated in FIG. 5, the reference current generator circuit 6' supplies the current pulse of the amplitude Ic' in an off-interval 2 and an off-interval 4. In this situation, the current is superimposed on a minus side, but how to obtain the mean value ave(ΔV)' is the same as that when the highside MOSFET 4 is on.

Midpoint Viave2'=(Vsave1'+Vsave3')/2 and Viave4'=(Vsave3'+Vsave5')/2 are calculated from the Voutd' mean value series whose index is odd, and respective differences ΔVave2'=Viave2'−Vsave2' and ΔVave4'=Viave4'−Vsave4' from Vsave2' and Vsave4' whose corresponding index is even are obtained. ΔVave2' and ΔVave4' thus calculated are calculated with a mean value ave(ΔV)' of the Voutd' variation generated by adding the current pulse of the amplitude Ic' to the solenoid current by the reference current generator circuit 6' as ave(ΔV)'=(ΔVave2'+ΔVave4'+ ... )/n.

A real gain a in Expression (1) can be calculated with high precision as the following Expression (4) with the use of ave(ΔVave) thus obtained, and Ic, Ic'.

$$a=Ic/ave(\Delta V), a'=Ic'/ave(\Delta V) \quad (4)$$

Further, as in the embodiment of FIGS. 1 to 4, the offsets b and b' can be obtained through Expression (1) and the following Expression (5) on the basis of an output Voutd_off of the current detector circuit 7 when the highside MOSFET 4 is off.

$$b=-a \cdot Voutd\_off, b'=-a' \cdot Voutd'\_off \quad (5)$$

Through the above method, even when the AD converter of the ΔΣ modulation system in which sampling of the peak value is difficult in principle is used, the gain a and the offset b can be calculated with high precision. Because the circuit of the AD converter of the ΔΣ modulation system can be downsized, the costs of the current control semiconductor device can be reduced according to this embodiment.

As described above, according to this embodiment, the current pulse is superimposed on the current of the load to vary the voltage digital value output by the AD converter, and the variation in the voltage digital value is subjected to the signal processing, thereby being capable of dynamically acquiring the gain in the linear relational expression of the voltage digital value output by the AD converter and the current digital value of the load. Then, because the gain can be corrected at an arbitrary timing, the frequency of correction is increased with the result that the current detection precision can be improved.

Subsequently, a configuration and operation of a current control semiconductor device according to another embodiment of the present invention will be described with reference to FIGS. 6 and 7.

Figure 6:
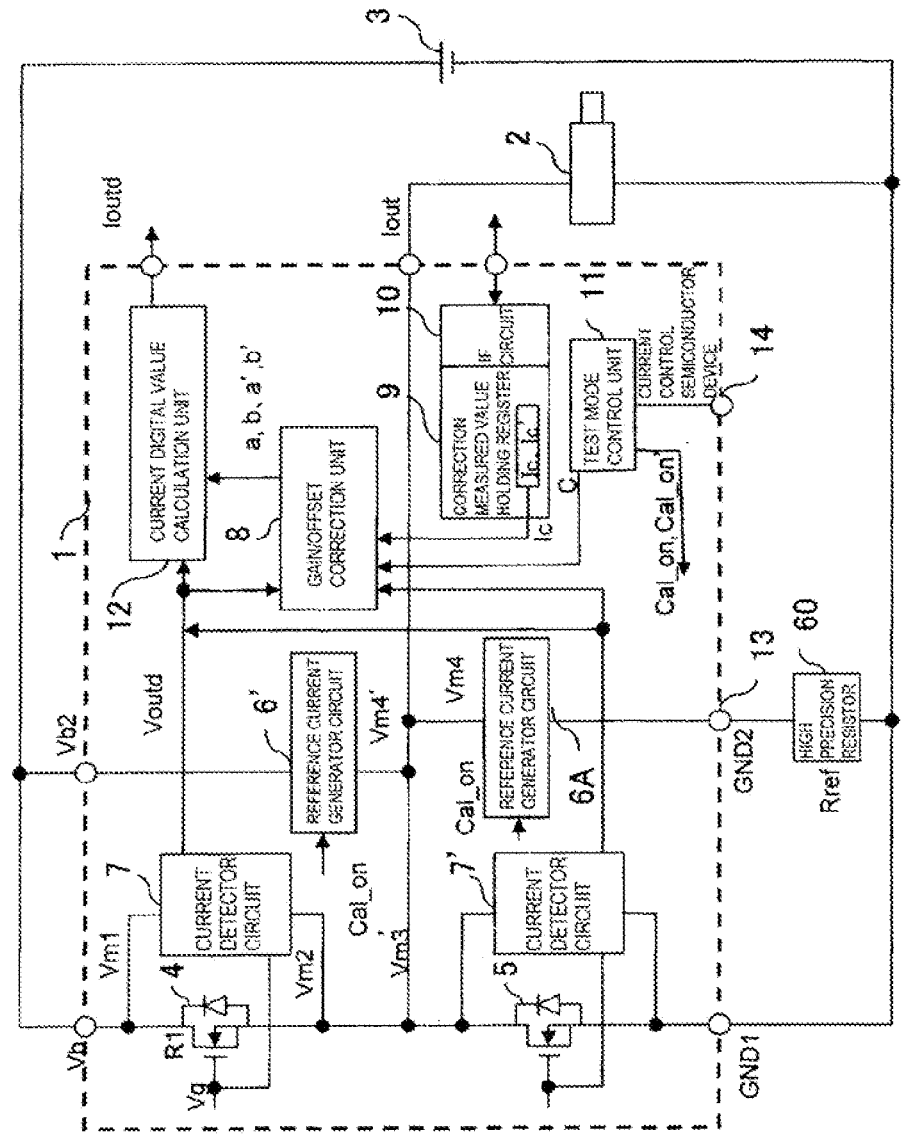
FIG. 6 is a block diagram illustrating a configuration of a current control semiconductor device according to another embodiment of the present invention.

FIG. 6 is a block diagram illustrating the configuration of the current control semiconductor device according to another embodiment of the present invention. The same symbols as those in FIG. 1 indicate identical parts. FIG. 7 is a block diagram illustrating a configuration of a reference current generator circuit used in the current control semiconductor device according to another embodiment of the present invention.

Referring to FIG. 6, in this embodiment, the reference current generator circuit 6 described in FIGS. 1 and 3 is implemented by a reference current generator circuit 6A and an external resistor 60 having a high-precision resistance value Rref.

Figure 7:
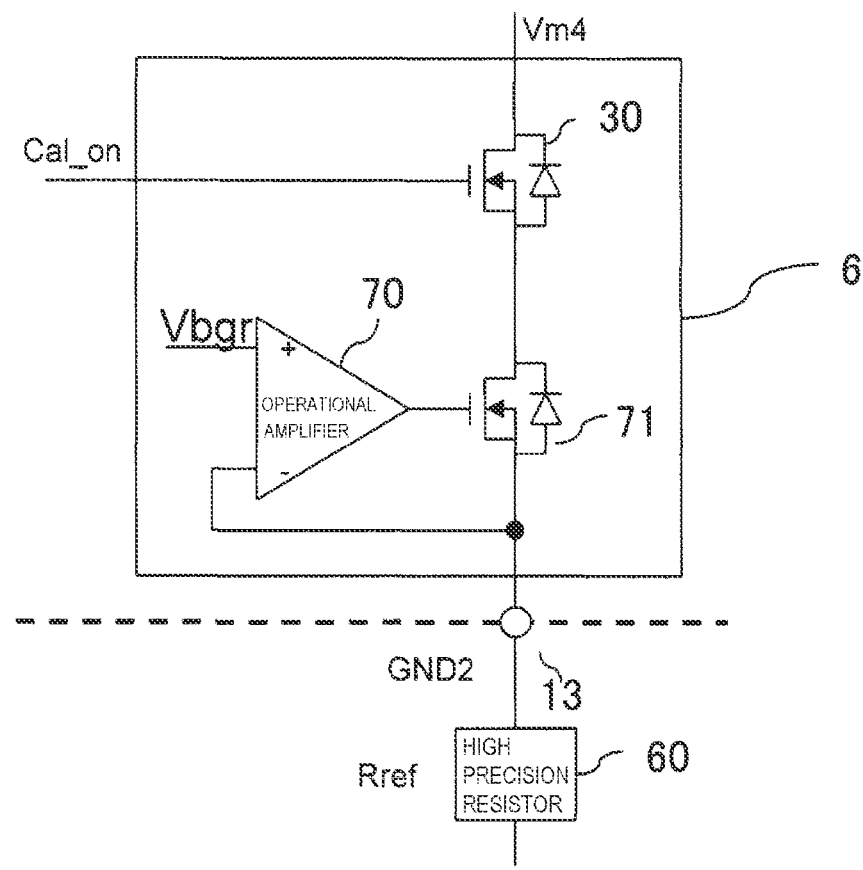
FIG. 7 is a block diagram illustrating a configuration of a reference current generator circuit used in the current control semiconductor device according to another embodiment of the present invention.

As illustrated in FIG. 7, the reference current generator circuit 6A includes the MOSFET 30, and the MOSFET 30 turns on when the gate signal Cal_on is high level. An operational amplifier 70 controls a gate voltage of a MOSFET 71 so that a terminal voltage of a GND 2 becomes equal to a reference voltage Vbgr input to a plus terminal of the operational amplifier, as a result of which a current of Ic=Vbgr/Rref flows therein.

In this example, in acquiring the reference current Ic, when not a minute current value flowing in the GND 2 terminal, but a voltage value of the reference voltage Vbgr, specifically the reference voltage Vbgr is generated by a band gap regulator, a voltage value of about 1.2V may be measured. Therefore, a measurement unit necessary to acquire the reference current Ic can be simplified, and a measurement precision can be further improved.

As described above, according to this embodiment, the current pulse is superimposed on the current of the load to vary the voltage digital value output by the AD converter, and the variation in the voltage digital value is subjected to the signal processing, thereby being capable of dynamically acquiring the gain in the linear relational expression of the voltage digital value output by the AD converter and the current digital value of the load. Then, because the gain can be corrected at an arbitrary timing, the frequency of correction is increased with the result that the current detection precision can be improved.

Also, since the current value of the constant current source is corrected by using a value measured from the external with high precision in advance, the correction precision can be improved.

Subsequently, a configuration and operation of an automatic transmission control device using the current control semiconductor device according to the respective embodiments of the present invention will be described with reference to FIG. 8.

Figure 8:
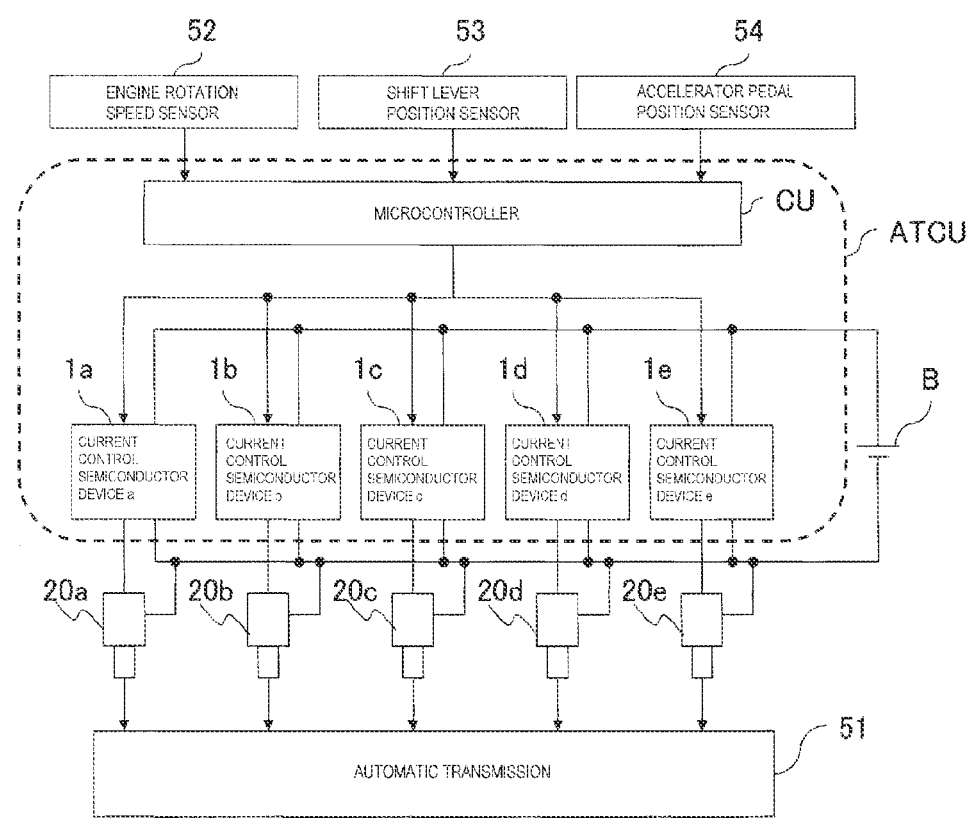
FIG. 8 is a block diagram illustrating a configuration of an automatic transmission control device using the current control semiconductor device according to the respective embodiments of the present invention.

FIG. 8 is a block diagram illustrating the configuration of the automatic transmission control device using the current control semiconductor device according to the respective embodiments of the present invention. Referring to FIG. 8, the same symbols as those in FIG. 1 indicate identical parts.

An automatic transmission control device ATCU includes a microcontroller CU which is a host control device of the current control semiconductor device illustrated in FIG. 1, and a plurality of current control semiconductor devices 1a, ..., 1e each corresponding to the current control semiconductor device 1.

The microcontroller 1 receives sensor values from an engine rotation speed sensor 52, a shift lever position sensor 53, and an accelerator pedal position sensor 54, and calculates an optimum transmission gear ratio according to the input sensor values. The microcontroller 1 also calculates hydraulic instruction values of a plurality of clutches (not shown) equipped in a transmission 51, and current value instruction values of solenoids 20a, ..., 20e corresponding to hydraulic pressures thereof for realizing the transmission gear ratio, and outputs current value instruction values Ia*, ..., Ie* to the current control semiconductor devices 1a, ..., 1e.

As described in the above-mentioned respective embodiments, because the current detection precision can be improved by the current control semiconductor devices 1a, ..., 1e, smooth shift transmission can be conducted, and a ride quality of a vehicle is improved.

In FIG. 8, the microcontroller CU receives the sensor values from three sensors of the engine rotation speed sensor 52, the shift lever position sensor 53, and the accelerator pedal position sensor 54. Alternatively, the number or type of input sensors may be changed according to the transmission control system. Also, in FIG. 8, the microcontroller CU receives the sensor values directly from the sensors. Alternatively, the microcontroller CU may receive the sensor values through another microcontroller or an IC. Also, FIG. 8 illustrates an example in which the transmission 51 has five clutches. Alternatively, the number of clutches, and the number of solenoid current control devices corresponding to the clutches may be changed according to the transmission mechanism.

Subsequently, a configuration and operation of a brake control device using the current control semiconductor device according to the respective embodiments of the present invention will be described with reference to FIG. 9.

Figure 9:
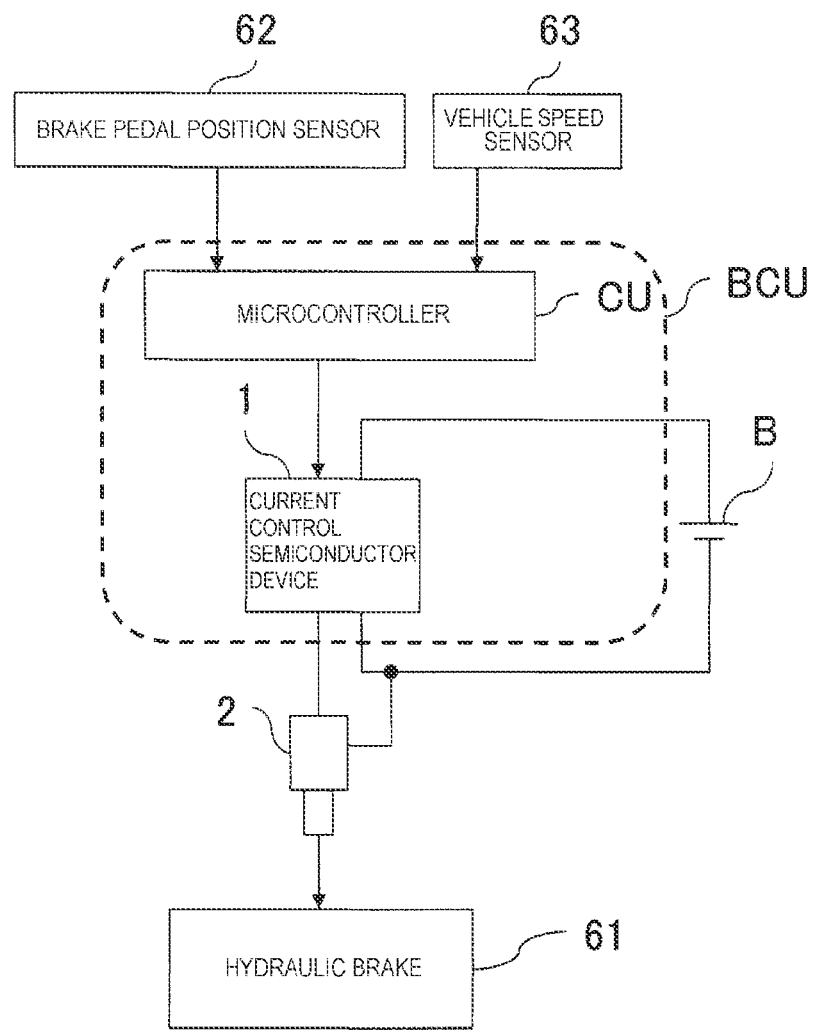
FIG. 9 is a block diagram illustrating a configuration of a brake control device using the current control semiconductor device according to the respective embodiments of the present invention.

FIG. 9 is a block diagram illustrating the configuration of the brake control device using the current control semiconductor device according to the respective embodiments of the present invention. Referring to FIG. 9, the same symbols as those in FIG. 1 indicate identical parts.

A brake control device BCU includes the microcontroller CU which is a host control device of the current control semiconductor device illustrated in FIG. 1 and the current control semiconductor device 1.

The microcontroller CU receives sensor values from a brake pedal position sensor 62 and a vehicle speed sensor 63, calculates an optimum brake force of the brake according to the input sensor values, calculates a hydraulic instruction value of a hydraulic brake 61 and a current value instruction value of the solenoid 2 corresponding to the hydraulic pressure for realizing the brake force, and outputs a current value instruction value I* to the current control semiconductor device 1.

As described in the above-mentioned respective embodiments, because the current detection precision can be improved by the current control semiconductor device 1, smooth brake can be conducted, and a ride quality of a vehicle is improved.

In FIG. 9, the microcontroller CU receives the sensor values from two sensors of the brake pedal position sensor 62 and the vehicle speed sensor 63. Alternatively, the number or type of input sensors may be changed according to a brake system. Also, in FIG. 9, the microcontroller CU receives the sensor values directly from the sensors. Alternatively, the microcontroller CU may receive the sensor values through another microcontroller or an IC.

Subsequently, a configuration and operation of a brushless motor control device using the current control semiconductor device according to the respective embodiments of the present invention will be described with reference to FIG. 10.

Figure 10:
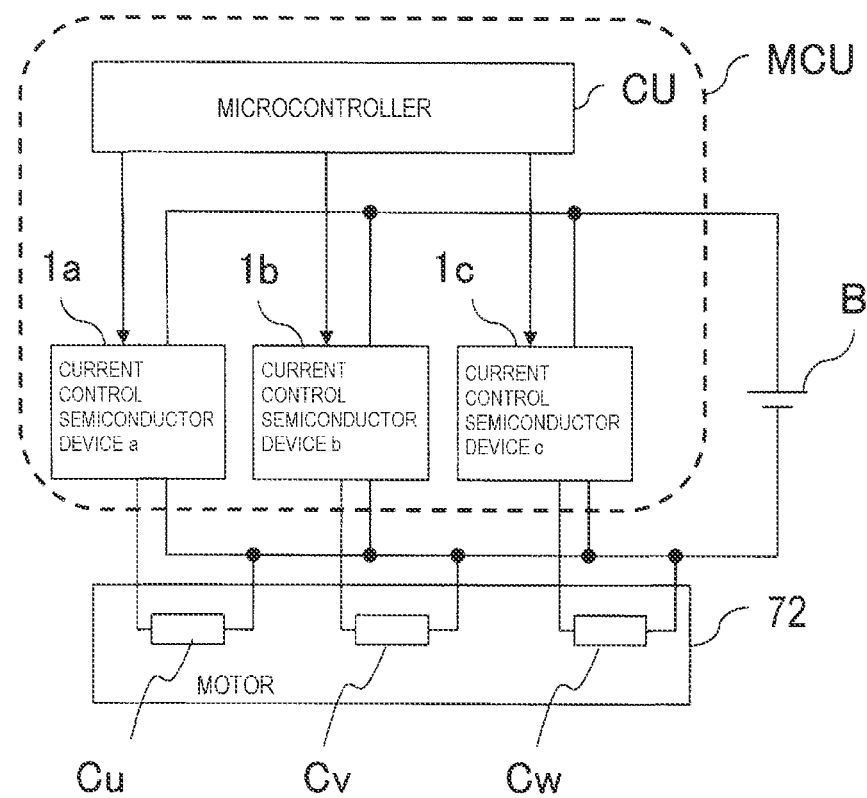
FIG. 10 is a block diagram illustrating a configuration of a brushless motor control device using the current control semiconductor device according to the respective embodiments of the present invention.

FIG. 10 is a block diagram illustrating the configuration of the brushless motor control device using the current control semiconductor device according to the respective embodiments of the present invention. Referring to FIG. 9, the same symbols as those in FIG. 1 indicate identical parts.

A brushless motor control device MCU includes the microcontroller CU which is a host control device of the current control semiconductor device illustrated in FIG. 1 and the current control semiconductor device 1.

The microcontroller CU calculates three-phase current instruction values to three-phase coils Cu, Cv, and Cw of a motor 72 for realizing a target rotation speed and torque of a motor, and outputs current value instruction values Iu*, Iv*, and Iw* to the current control semiconductor devices 1a, ..., 1c.

As described in the above-mentioned respective embodiments, because the current detection precision can be improved by the current control semiconductor devices 1a, ..., 1c, smooth motor control can be conducted.

As described above, according to this embodiment, the current pulse is superimposed on the current of the load to vary the voltage digital value output by the AD converter, and the variation in the voltage digital value is subjected to the signal processing, to thereby dynamically acquire the gain in the linear relational expression of the voltage digital value output by the AD converter and the current digital value of the load. For that reason, because the gain can be corrected at an arbitrary timing, the frequency of correction is increased with the result that the current can be detected with high precision. That is, since the variation in the gain a and the offset b is dynamically corrected, the current can be detected within the IC of one chip with high precision.

Also, since the current value of the constant current source is corrected by using a value measured from the external with high precision in advance, the correction precision can be improved.

REFERENCE SIGN LIST 1, current control semiconductor device
2, solenoid
3, battery
4, highside MOSFET
5, lowside MOSFET
6, 6', 6A, reference current generator circuit
7, 7', current detector circuit
8, gain/offset correction unit
9, correction measured value holding register
10, IF circuit
11, test mode control unit
12, current digital value calculation unit

The invention claimed is:
1. A current control semiconductor device having
a transistor that drives a load,
a current-voltage converter circuit that converts a current of the load into a voltage, and
an AD converter that converts an output voltage of the current-voltage converter circuit into a digital value on an identical semiconductor chip, the current control semiconductor device comprising:
a reference current generation unit that superimposes a current pulse on the current of the load to vary a voltage digital value output by the AD converter;
a gain/offset correction unit that subjects a variation in the voltage digital value by the reference current generation unit to signal processing to dynamically acquire a gain and an offset in a linear relational expression of the voltage digital value output by the AD converter and a current digital value of the load; and
a current digital value calculation unit that corrects a voltage value output by the AD converter with the use of the gain and the offset acquired by the gain/offset correction unit.

2. The current control semiconductor device according to claim 1, further comprising: a correction measured value holding unit that holds a current value of the current pulse measured from outside of the current control semiconductor device with high precision,
wherein the gain/offset correction unit dynamically acquires the gain in the linear relational expression of the voltage digital value output by the AD converter and the current digital value of the load with the use of the current value of the current pulse held by the correction measured value holding unit, and a signal processing result of the voltage digital value.

3. The current control semiconductor device according to claim 2,
wherein a current of the current pulse is generated with the use of a resistor and a reference voltage.

4. The current control semiconductor device according to claim 2, wherein a cycle of the current pulse is an integral multiple of a sampling cycle of the AD converter.

5. The current control semiconductor device according to claim 2,
wherein when a current is controlled by PWM, a cycle of the current pulse is an integral multiple of the PWM cycle.

6. A control device including a current control semiconductor device, and a microcontroller that controls the current control semiconductor device,
wherein the current control semiconductor device includes, on an identical semiconductor chip,
a transistor that drives a load,
a current-voltage converter circuit that converts a current of the load into a voltage, and
an AD converter that converts an output voltage of the current-voltage converter circuit into a digital value,
wherein the current control semiconductor device comprises:
a reference current generation unit that superimposes a current pulse on the current of the load to vary a voltage digital value output by the AD converter;
a gain/offset correction unit that subjects a variation in the voltage digital value by the reference current generation unit to signal processing to dynamically acquire a gain and an offset in a linear relational expression of the voltage digital value output by the AD converter and a current digital value of the load; and
a current digital value calculation unit that corrects a voltage value output by the AD converter with the use of the gain and the offset acquired by the gain/offset correction unit.

* * * * *